United States Patent
Shinoda

(10) Patent No.: US 10,406,652 B2
(45) Date of Patent: Sep. 10, 2019

(54) POLISHING COMPOSITION AND POLISHING METHOD USING THE SAME

(71) Applicant: FUJIMI INCORPORATED, Kiyosu-shi, Aichi (JP)

(72) Inventor: Toshio Shinoda, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 120 days.

(21) Appl. No.: 15/127,294

(22) PCT Filed: Feb. 26, 2015

(86) PCT No.: PCT/JP2015/055683
§ 371 (c)(1),
(2) Date: Sep. 19, 2016

(87) PCT Pub. No.: WO2015/146468
PCT Pub. Date: Oct. 1, 2015

(65) Prior Publication Data
US 2017/0136600 A1 May 18, 2017

(30) Foreign Application Priority Data

Mar. 28, 2014 (JP) .................................. 2014-069265

(51) Int. Cl.
| | |
|---|---|
| *B24D 3/00* | (2006.01) |
| *C09K 3/14* | (2006.01) |
| *B24B 37/04* | (2012.01) |
| *H01L 21/3105* | (2006.01) |
| *C09G 1/02* | (2006.01) |
| *B24D 3/02* | (2006.01) |
| *B24D 11/00* | (2006.01) |
| *B24D 18/00* | (2006.01) |
| *C08K 3/14* | (2006.01) |
| *C08K 3/22* | (2006.01) |
| *C08K 3/36* | (2006.01) |

(52) U.S. Cl.
CPC .............. *B24B 37/044* (2013.01); *C09G 1/02* (2013.01); *C09K 3/1463* (2013.01); *H01L 21/31053* (2013.01); *C08K 3/14* (2013.01); *C08K 3/22* (2013.01); *C08K 3/36* (2013.01)

(58) Field of Classification Search
USPC .......................................... 51/293, 307, 309
See application file for complete search history.

(56) References Cited

U.S. PATENT DOCUMENTS

| | | | |
|---|---|---|---|
| 2003/0124959 A1 | 7/2003 | Schroeder et al. | |
| 2003/0211815 A1 | 11/2003 | Carter et al. | |
| 2004/0209555 A1* | 10/2004 | Sun .......................... | C09G 1/02 451/41 |
| 2007/0209287 A1 | 9/2007 | Chen et al. | |
| 2009/0056231 A1* | 3/2009 | White ....................... | C09G 1/02 51/298 |
| 2012/0077422 A1 | 3/2012 | Yoshino | |
| 2013/0005219 A1 | 1/2013 | Takemura et al. | |
| 2013/0146804 A1 | 6/2013 | Mizuno et al. | |
| 2015/0232705 A1 | 8/2015 | Kachi et al. | |

FOREIGN PATENT DOCUMENTS

| | | |
|---|---|---|
| IT | 201139634 A1 | 11/2011 |
| JP | 2005-513765 A | 5/2005 |
| JP | 2008-112970 A | 5/2008 |
| JP | 2008112970 A * | 5/2008 |
| JP | 2009-530811 A | 8/2009 |
| JP | 2012-040671 A | 3/2012 |
| JP | 2012-135863 A | 7/2012 |
| JP | 2013-094906 A | 5/2013 |
| JP | 2013-229098 A | 11/2013 |
| WO | WO 2014/041991 A1 | 3/2014 |
| WO | WO 2014/045937 A1 | 3/2014 |

OTHER PUBLICATIONS

Office action dated Jun. 28, 2017 in corresponding Chinese patent application No. 201580017238.8 English translation provided.
Office Action dated Jul. 23, 2018 in Taiwanese Patent Application No. 104107910 with its English translation.
Office Action dated Sep. 4, 2018 in Japanese Patent Application No. 2016-510165 with its English translation.
Office Action for Decision of Refusal dated Feb. 26, 2019 in Japanese Patent Application No. 2016-510165 with its English translation.

* cited by examiner

*Primary Examiner* — James E McDonough
(74) *Attorney, Agent, or Firm* — Foley & Lardner LLP

(57) ABSTRACT

The present invention provides a polishing composition with which differences in height of a SiN film can be sufficiently removed.
The present invention is a polishing composition for use in polishing a polishing object having a surface which is positively charged at a pH of less than 6, containing water, abrasive grains, and an anionic copolymer having a specific unit structure, and having a pH of less than 6, wherein the anionic copolymer has at least two acidic groups having different acidities.

5 Claims, No Drawings

POLISHING COMPOSITION AND POLISHING METHOD USING THE SAME

TECHNICAL FIELD

The present invention relates to a polishing composition used for a process of manufacturing a semiconductor device and a polishing method using the polishing composition.

BACKGROUND ART

According to an improvement in performance of a semiconductor device, a technique for having wirings with higher density and higher integration is required for a process of manufacturing a semiconductor device. For such process of manufacturing a semiconductor device, CMP (Chemical Mechanical Polishing) is an essential process now. In accordance with a progress in micronization of a semiconductor circuit, higher flatness is required for irregularities on a pattern wafer, and thus it is needed to achieve high flatness of nano-order by CMP. To achieve even higher flatness by CMP, it is preferable that the convex part of a pattern wafer is polished at a high polishing rate while the concave part is not much polished.

Herein, when a pattern wafer consisting of a silicon nitride film (SiN film) is used, the silicon nitride film generally has irregularities, and thus not only the convex part but also the concave part is scraped off at the time of polishing such material. Accordingly, it is difficult to sufficiently remove the irregularities.

Furthermore, a semiconductor wafer is composed of different materials like polycrystalline silicon for forming a circuit, a silicon oxide as an insulating material, or silicon nitride for protecting a surface of silicon dioxide which is not a part of a trench or a via against damages during etching. For such reasons, a phenomenon like dishing, in which a material like polycrystalline silicon or silicon oxide that is relatively soft and can easily react with a polishing agent is excessively scraped off compared to neighboring silicon nitride or the like, occurs and thus differences in the height are remained.

From the above, it is required to remove sufficiently the differences in the height during a step for polishing a pattern wafer which consists of a hard and chemically stable material like silicon nitride.

As a technique for responding to the above requirements, in JP 2009-530811 W (US 2007/209287 A), a chemical mechanical polishing composition with pH of from 1 to 6 which is for use in polishing simultaneously a circuit material containing tungsten and titan nitride as a hard coat layer and contains (a) a polishing agent, (b) 0.1 mM to 10 mM of malonic acid, (c) 0.1 mM to 100 mM of aminocarboxylic acid, (d) 0.1 mM to 100 mM of sulfate ion, and (e) water is disclosed.

Furthermore, in JP 2012-040671 A (US 2013/146804 A), as a polishing composition allowing polishing of a polishing object with insufficient chemical reactivity such as silicon nitride at higher speed compared to polycrystalline silicon or the like, a polishing composition containing colloidal silica which is immobilized with organic acid and having a pH of 6 or less is disclosed.

SUMMARY OF INVENTION

However, the polishing composition of a related art has a problem that the irregularities included in a SiN film or the like cannot be sufficiently removed by a process for polishing semiconductor.

Accordingly, an object of the present invention is to provide a polishing composition with which differences in the height of a SiN film can be sufficiently removed.

To solve the above problems, the inventors of the present invention conducted intensive studies. As a result, it was found that, by using an acidic polishing composition which contains a specific anionic copolymer with abrasive grains, a convex part of silicon nitride of which surface is positively charged at a pH of less than 6 can be polished at remarkably higher polishing rate compared to a concave part. Based on such finding, the present invention is completed accordingly.

That is, the present invention is a polishing composition for use in polishing a polishing object having a surface which is positively charged at a pH of less than 6, containing water, abrasive grains, and an anionic copolymer having a unit structure represented by the following General Formula 1 or the following General Formula 2, and having a pH of less than 6, wherein the anionic copolymer has at least two acidic groups having different acidities.

[Chem. 1]

[General Formula 1]

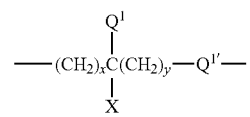

(In the General Formula 1, $Q^1$ is hydrogen; an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; or an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^{1'}$ is any one of a single bond, an ether bond, an ester bond, an amide bond, and a carbonyl bond, x is an integer of from 0 to 10, y is an integer of from 0 to 10, X is an acidic group selected among a sulfonic acid group, a carboxyl group, a hydroxyl group, and a phosphoric acid group, an aliphatic hydrocarbon group with 1 to 10 carbon atoms having at least one of those acidic groups, or an aromatic hydrocarbon group with 6 to 12 carbon atoms having at least one of those acidic groups.)

[Chem. 2]

[General Formula 2]

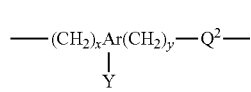

(In the General Formula 2, Ar is a substituted or non-substituted aromatic group with 6 to 12 carbon atoms, provided that when Ar is a substituted aromatic group, a substituent includes an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; and an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^2$ is any one of a single bond, an ether bond, an ester bond, an amide bond, and a carbonyl bond, x is an integer of from 0 to 10, y is an integer of from 0 to 10, Y is an acidic group selected among a sulfonic acid group, a carboxyl group, a hydroxyl group, and a phosphoric acid group, an aliphatic hydrocarbon group with 1 to 10 carbon atoms having at least one of those acidic groups, or an aromatic hydrocarbon group with 6 to 12 carbon atoms having at least one of those acidic groups.)

DESCRIPTION OF EMBODIMENTS

Hereinbelow, the present invention is described.

<Polishing Composition>

The first aspect of the present invention is a polishing composition for use in polishing a polishing object having a surface which is positively charged in a pH range of the polishing composition used for polishing, containing an anionic copolymer which has a unit structure represented by the above General Formula 1 or a unit structure represented by the above General Formula 2, and having a pH of less than 6. By having such constitution, the convex part of a pattern wafer which includes a SiN film with irregularities can be scraped off with high selectivity, and thus differences in the height of a pattern wafer can be sufficiently removed.

Although the reason for having selective scrape-off of the convex part of a pattern wafer, which includes a SiN film with irregularities, by using the polishing composition of the present invention remains unclear, it is believed to be based on the following mechanism.

First, at a pH of less than 6, the surface of a polishing object like silicon nitride is positively charged while the hydroxyl group on a surface of abrasive grains like silica is protonated so as to have reduced negative charge on the surface. Among multiple acidic groups with different acidities that are included in an anionic copolymer, an acidic group which is difficult to be ionized due to relatively low acidity exhibits an affinity toward a surface of abrasive grains like silica. Meanwhile, an acidic group like sulfonic acid group which is easily ionized due to high acidity exhibits an affinity toward an aqueous phase or a polishing object which has positive charges.

Such an anionic copolymer is electrostatically adsorbed on a positively charged polishing object, in which polishing pressure is applied on the convex part due to collision with abrasive grains, and the anionic copolymer and abrasive grains are attracted to each other according to the polishing pressure. As a result, the anionic copolymer in the convex part is more easily removed from the surface of a polishing object compared to the concave part. For such reasons, the polishing proceeds in the convex part without being affected by an anionic copolymer. Meanwhile, it is believed that, as the concave part is sterically unlikely to be collided with abrasive grains, a layer adsorbed with an anionic layer is easily remained, and thus the polishing rate is suppressed.

Meanwhile, the above mechanism is based on a presumption and the present invention is not at all limited to the above mechanism.

[Anionic Copolymer]

The anionic copolymer to be contained in the polishing composition of the present invention has two or more acidic groups having different acidities. Preferably, it has two acidic groups having different acidities. More preferably, it has both an acidic group having higher acid dissociation constant than pH of the polishing composition and an acidic group having lower acid dissociation constant than pH of the polishing composition. When two or more acidic groups having different acidities are included, all the unit structures of the corresponding anionic copolymer may be represented by any one of the General Formula 1 or the General Formula 2, or both the unit structure represented by the General Formula 1 and the unit structure represented by the General Formula 2 may be included. X and Y may be an acidic group with same structure. Furthermore, the anionic copolymer may have 3 or more unit structures.

By containing the above anionic copolymer, the polishing composition of the present invention has an activity of scraping off selectively the convex part of irregularities on the surface of a polishing object like silicon nitride, which is positively charged at a pH of less than 6. For example, according to one preferred embodiment of the present invention, provided is a polishing method or a method for producing a substrate containing a step of polishing a convex part of a surface of a polishing object, which is positively charged at a pH of less than 6, at a polishing rate of at least 10 times relative to a concave part thereof.

The anionic copolymer may be a copolymer of two or more monomers having an acidic group or a copolymer which is obtained by copolymerization of two or more monomers, which has a functional group capable of being converted to an acidic group followed by conversion of the functional group to an acidic group. The copolymer may be any one of a random copolymer, an alternating copolymer, a block copolymer, and a graft copolymer. However, it is preferably a block copolymer in which the acidic groups of each type are localized.

Furthermore, the anionic copolymer contained in the polishing composition of the present invention is not particularly limited as long as it has a unit structure represented by the following General Formula 1 or a unit structure represented by the following General Formula 2, and it may be a vinyl-based copolymer or a condensed copolymer. As for the anionic copolymer, a commercially available product can be used or it can be obtained by introducing an acidic group to a commercially available resin.

[Chem. 3]

[General Formula 1]

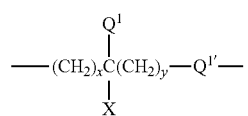

(in the General Formula 1, $Q^1$ is hydrogen; an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; or an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^{1'}$ is any one of a single bond, an ether bond, an ester bond, an amide bond, and a carbonyl bond, x is an integer of from 0 to 10, y is an integer of from 0 to 10, X is an acidic group selected among a sulfonic acid group, a carboxyl group, a hydroxyl group, and a phosphoric acid group, an aliphatic hydrocarbon group with 1 to 10 carbon atoms having at least one of those acidic groups, or an aromatic hydrocarbon group with 6 to 12 carbon atoms having at least one of those acidic groups.)

[Chem. 4]

[General Formula 2]

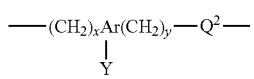

(in the General Formula 2, Ar is a substituted or non-substituted aromatic group with 6 to 12 carbon atoms, provided that when Ar is a substituted aromatic group, a substituent includes an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; and an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^2$ is any one of a single bond, an ether bond, an ester bond, an amide bond, and a carbonyl bond, x is an integer of from 0 to 10, y is an integer of from 0 to 10, Y is an acidic group selected among a sulfonic acid group, a carboxyl group, a hydroxyl group, and a phosphoric acid group, an aliphatic hydrocarbon group with 1 to 10 carbon atoms having at least one of those acidic groups, or an aromatic hydrocarbon group with 6 to 12 carbon atoms having at least one of those acidic groups.)

Furthermore, because the single bond represents a bond which is formed by sharing of one pair of covalent electrons, when $Q^{1'}$ or $Q^2$ represents a single bond, it means that an atom like carbon atom is not included in $Q^{1'}$ or $Q^2$ and the atoms at both sides of $Q^{1'}$ or $Q^2$ are bound to each other via a single bond.

The acidic group or a substituent group bonded with an acidic group exhibiting different acidities, which is contained in an anionic copolymer, may have the same or different structure. Examples of a suitable combination of different acidic groups include a combination of sulfonic acid group and carboxyl group. Furthermore, in the case of the same acidic group or a substituent group bonded with the same acidic group, a difference in acidity may be exhibited due to a different structure of a main chain. In the case of a copolymer of acrylic acid and fumaric acid, for example, it consists of a unit structure represented by —CH(COOH)— and a unit structure represented by —CH$_2$CH(COOH)—. In that case, since an acidic group is bonded to an adjacent carbon in the former unit structure, negative charges which remain after proton dissociation are stabilized by an adjacent acidic group and proton dissociation from the acidic group is promoted. As such, it is believed that, even for a case of using an anionic copolymer in which an acidic group or a substituent group bonded with an acidic group having different acidities has the same structure, the effect of the present invention can be obtained.

Molecular weight of the anionic copolymer is, from the viewpoint of protection activity, preferably 500 or more, and more preferably 1,000 or more. Furthermore, from the viewpoint of a dispersion property, it is preferably 100,000 or less, and more preferably 50,000 or less. Meanwhile, the weight average molecular weight can be measured by GPC (gel permeation chromatography).

Content of the anionic copolymer relative to the polishing composition of the present invention can be suitably adjusted depending on the content of abrasive grains or a polishing object. Although it is not particularly limited, it may be in the range of from 0.1 to 100,000 ppm. When it is within the range, a polishing object like silicon nitride can be flattened at sufficient polishing rate.

The acid dissociation constant (pKa) of at least one acidic group of the acidic groups with different acidities in an anionic copolymer is preferably lower than the pH of the polishing composition. As the acid dissociation constant (pKa) of at least one acidic group is lower than the pH of the polishing composition, the anionic copolymer is ionized and can be easily adsorbed onto a polishing object. Accordingly, scraping-off of a concave part by abrasive grains can be suppressed.

[Preparation of Anionic Copolymer]

The anionic copolymer contained in the polishing composition of the present invention can be prepared by a method known in the art, and it can be prepared by the following method, for example.

(1) Method for Introducing an Anionic Group to a Copolymer of Monomers to which an Anionic Group can be Introduced Such as Styrene, Vinyl Toluene, or Vinyl Naphthalene or a Copolymer of Those Monomers and a Vinyl Compound Monomer Examples of the monomer to which the anionic group can be introduced include diacrylic acid ester or dimethacrylic acid ester of ethylene glycol or polyethylene glycol, styrene, vinyl toluene, vinyl sulfone, and vinyl naphthalene.

For example, according to sulfonization of a crosslinked copolymer of styrene and divinyl benzene, the anionic copolymer used in the present invention can be produced.

The vinyl compound monomer which can be used for producing an anionic copolymer according to above method is not particularly limited, but examples thereof include acrylic acid ester or methacrylic acid ester such as methyl (meth)acrylate, ethyl (meth)acrylate, isopropyl (meth)acrylate, n-butyl (meth)acrylate, isobutyl (meth)acrylate, n-amyl (meth)acrylate, isoamyl (meth)acrylate, n-hexyl (meth)acrylate, 2-ethylhexyl (meth)acrylate, octyl (meth)acrylate, decyl (meth)acrylate, dodecyl (meth)acrylate, octadecyl (meth)acrylate, cyclohexyl (meth)acrylate, phenyl (meth)acrylate, benzyl (meth)acrylate, 2-hydroxyethyl (meth)acrylate, hydroxypropyl (meth)acrylate, glycidyl methacrylate, or glycidyl acrylate, vinyl esters such as vinyl acetate, acrylonitrile, methacrylonitrile, aromatic vinyls such as 2-methylstryene, t-butylstyrene, chlorostryene, vinyl anisole, or divinyl benzene, halogenovinylidenes such as vinylidene chloride or vinylidene fluoride, ethylene, propylene, isopropylene butadiene, vinyl pyrrolidone, vinyl chloride, vinyl ether, vinyl ketone, chloroprene, acrylonitrile, butadiene, and chloroprene.

(2) Method for Copolymerizing Vinyl Compounds Having an Anionic Group Such as Methacrylic Acid, Methyl Methacrylate, Maleic Anhydride, Vinyl Sulfonic Acid, Methyl Vinyl Sulfonate, p-Styrene Sulfonic Acid, or Methyl p-Styrene Sulfonate, or a Method for Copolymerizing Those Vinyl Compounds Having an Anionic Group and the Above-Mentioned Vinyl Compound Monomer According to this method, if necessary, anion exchange volume (cation exchange volume) can be adjusted by polymerizing a monomer not having an ionic group or by hydrolyzing a carboxylic acid ester group or a sulfonic acid ester group in the obtained copolymer.

Examples of the vinyl compound having an anionic group which may be used for producing an anionic copolymer by the above method are as follows, although it is not particularly limited.

Examples of the vinyl compound having a carboxyl group include an acrylic acid-based monomer such as acrylic acid, methacrylic acid, crotonic acid, isocrotonic acid, 2-ethyl acrylic acid, or 3-tert-butylacrylic acid; and a maleic acid-based monomer such as maleic acid, methyl maleic acid, phenyl maleic acid, chloro maleic acid, fumaric acid, itaconic acid, or muconic acid.

Examples of the vinyl compound having a sulfonic acid group include 2-acrylamidepropane sulfonic acid, 2-acrylamide-n-butanesulfonic acid, 2-acrylamide-n-hexane sulfonic acid, 2-acrylamide-n-octane sulfonic acid, 2-acrylamide-n-dodecane sulfonic acid, 2-acrylamide-2-methylpropane sulfonic acid, 2-acrylamide-2-phenylpropane sulfonic acid, 2-acrylamide-2,4,4-trimethylpentane sulfonic acid, 2-acrylamide-2-(4-chlorophenyl)propane sulfonic acid, 2-methacrylamide-n-tetradecane sulfonic acid, sodium 4-methacrylamide benzene sulfonate, 2-sulfoethyl methacrylate, p-vinylbenzene sulfonic acid, styrene sulfonic acid, ethylene sulfonic acid, and vinyl sulfonic acid.

Examples of the vinyl compound having a hydroxyl group include 2-hydroxyethyl (meth) acrylate, 2-hydroxypropyl (meth)acrylate, 2-hydroxybutyl (meth) acrylate, 3-hydroxybutyl (meth) acrylate, 4-hydroxybutyl (meth)acrylate, 6-hydroxyhexyl (meth)acrylate, 3-hydroxy-2-ethylhexyl (meth) acrylate, polyethylene glycol mono(meth)acrylate, polypropylene glycol mono(meth)acrylate, pentaerythritol tri(meth)acrylate, dipentaerythritol penta(meth)acrylate, glycidyl methacrylate-(meth)acrylic acid adduct, and di(meth)acrylic acid ester of 1,1,1-trimethylolpropane or glycerol.

Examples of the vinyl compound having a phosphoric acid group include vinyl phosphonic acid, (methacryloxyethyl) phosphate, diphenyl-2-acryloyloxyethyl phosphate, diphenyl-2-methacryloyloxyethyl phosphate, and dibutyl-2-acryloyloxyethyl phosphate.

(3) Method for Polycondensating Phenols Having an Anionic Group with Aldehydes

Examples of the phenols having an anionic group for this method include phenol sulfonic acid, naphthol sulfonic acid, p-oxybenzene sulfonic acid, and sodium salicylate. Furthermore, as aldehydes, formalin, paraformaldehyde, glyoxazal, and furfurals are used. In such case, to adjust the cation exchange volume, phenol, cresol, naphthol, resol or the like may be used as a copolymerization component.

(4) Method for Polycondensating Polyhydric Carboxylic Acid (Dicarboxylic Acid) and Polyalcohol (Diol)

According to this method, for example, by reacting 2,6-naphthalene dicarboxylic acid or an ester-forming derivative thereof, isophthalic acid or an ester-forming derivative thereof, or 5-sodium sulfoisophthalic acid or an ester-forming derivative thereof with tramethylene glycol, 9,9-bis[4-(2-hydroxyethoxy)phenyl]fluorene, bisphenol A ethylene oxide adduct component to form a monomer or an oligomer and polycondensating it under vacuum condition, a polyester can be prepared. An acidic group may be introduced later to the polyester which is prepared as above, or it is also possible that a substituent group which may be converted to an acidic group is introduced in advance to a monomer and converted to an acidic group after the condensation polymerization.

(5) Method for Polycondensating Bisphenol and Aromatic Dihalide Containing Acidic Group Examples of the aromatic dihalide containing acidic group which may be used for this method include 4,4'-dichlorodiphenylsulfone, 4,4'-difluorodiphenylsulfone, 4,4'-dichlorodiphenyl ketone, 4,4'-dichlorodiphenylphenylphosphine oxide, and 4,4'-difluorodiphenylphenylphosphine oxide.

(6) Method for Reacting Dicarboxylic Acid Dihalide and Diamine by Low Temperature Solution Polymerization or Interface Polymerization Examples of the dicarboxylic acid dihalide which may be used for this method include terephthalic acid chloride, 2-chloroterephthalic acid chloride, 2,5-dichloroterephthalic acid chloride, 2,6-dichloroterephthalic acid chloride, and 2,6-naphthalene dicarboxylic acid chloride. Examples of the diamine which may be used include an aromatic diamine such as p-phenylene diamine, 2-chloro p-phenylene diamine, 2,5-dichloro p-phenylene diamine, 2,6-dichloro p-phenylene diamine, m-phenylene diamine, 3,4'-diaminodiphenyl ether, 4,4'-diaminodiphenyl ether, 4,4'-diaminodiphenylmethane, 4,4'-diaminodiphenylsulfone, or 3,3'-diaminodiphenylsulfone.

[Abrasive Grains]

The abrasive grains contained in the polishing composition of the present invention have an activity of polishing mechanically a polishing object, and they improve polishing rate of a polishing object by a polishing composition.

The abrasive grains may be any one of inorganic particles, organic particles, and organic and inorganic composite particles. Specific examples of the inorganic particles include particles composed of metal oxide such as silica, alumina, ceria, or titania, silicon nitride particles, silicon carbide particles, and boron nitride particles. Specific examples of the organic particles include polymethylmethacrylate (PMMA) particles. Meanwhile, the abrasive grains may be used either singly or in combination of 2 or more kinds. Furthermore, a commercially available product or a synthesized product may be used as abrasive grains.

Among those abrasive grains, silica is preferable. Particularly preferred is colloidal silica.

The abrasive grains may be surface-modified. Common colloidal silica has a surface charge of nearly zero under acidic conditions, and therefore tends to cause agglomeration without electrical repulsion between silica particles under the acidic conditions. In contrast, abrasive grains which have been surface-modified so as to have a negatively charged surface even under acidic conditions having a pH of less than 6, are strongly repelled with each other and are well dispersed even under acidic conditions. As a result, the storage stability of the polishing composition is improved. Such surface-modified abrasive grains can be obtained by a method of mixing a metal such as aluminum, titanium, or zirconium, or an oxide thereof with abrasive grains and doping it onto a surface of the abrasive grains, or a method of introducing an acidic functional group like sulfonic acid on a surface of silica. Among them, preferred is Al (aluminum) doped silica or colloidal silica immobilized with organic acid.

As for the method for obtaining Al doped silica, a method of adding aluminate soda to a dispersion of colloidal silica can be used. This method is described in detail in JP 3463328 B1 and JP S63-123807 A and those descriptions can be applied to the present invention.

An organic acid is immobilized to a surface of colloidal silica, for example, by chemically bonding a functional group of the organic acid to the surface of the colloidal silica. Only by making the colloidal silica and the organic acid coexist, the organic acid is not immobilized to the colloidal silica. For example, sulfonic acid as an organic acid can be immobilized to colloidal silica by a method described in "Sulfonic acid-functionalized silica through quantitative oxidation of thiol groups", Chem. Commun. 246-247 (2003). Specifically, colloidal silica of which surface is immobilized with sulfonic acid can be obtained by coupling a silane coupling agent having a thiol group such as 3-mercaptopropyl trimethoxysilane to colloidal silica and then oxidizing the thiol group with hydrogen peroxide. Alternatively, carboxylic acid can be immobilized to colloidal silica by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000), for example. Specifically, colloidal silica of which surface is immobilized with carboxylic acid can be obtained by coupling a silane coupling agent containing a photoreactive 2-nitrobenzyl ester to colloidal silica and then irradiating the resulting product with light.

The lower limit of an average primary particle diameter of the abrasive grains is preferably 5 nm or more, more preferably 7 nm or more, and still more preferably 10 nm or more. Furthermore, the upper limit of the average primary particle diameter of the abrasive grains is preferably 500 nm or less, more preferably 250 nm or less, and still more preferably 100 nm or less. Within such a range, the polishing rate of the polishing object by the polishing composition is improved, and it is possible to further suppress an occurrence of polishing defect (scratch) on the surface of the polishing object after the polishing object is polished by using the polishing composition. Meanwhile, the average primary particle diameter of the abrasive grains is calculated, for example, based on a specific surface area of the abrasive grains which is measured by a BET method.

The upper limit of an average secondary particle diameter of the abrasive grains is preferably 500 nm or less, more preferably 400 nm or less, and still more preferably 300 nm or less. The average secondary particle diameter value of the abrasive grains can be determined by, for example, the laser light scattering method.

The lower limit of the average secondary particle diameter of the abrasive grains is preferably 5 nm or more, more preferably 7 nm or more, and still more preferably 10 nm or more.

The average degree of association of the abrasive grains, which is obtained by dividing the average secondary particle diameter value of the abrasive grains by the average primary particle diameter value, is preferably 1 or more, and more preferably 1.2 or more. As the average degree of association increases, there is an advantage of having increased rate for removing a polishing object by the polishing composition.

The average degree of association of the abrasive grains is also preferably 5 or less, more preferably 4 or less, and still more preferably 3 or less. As the average degree of association of the abrasive grains decreases, a polished surface with fewer surface defects is easily obtained when the polishing object is polished by using the polishing composition.

The lower limit of the content of the abrasive grains in the polishing composition is preferably 0.05% by mass or more, more preferably 0.5% by mass or more, still more preferably 1% by mass or more, and particularly preferably 2% by mass or more. Furthermore, the upper limit of the content of the abrasive grains in the polishing composition is preferably 50% by mass or less, more preferably 30% by mass or less, and still more preferably 20% by mass or less. Within such a range, the polishing rate of the polishing object is increased and cost related to the polishing composition can be saved.

[pH Adjusting Agent]

The pH value of the polishing composition of the present invention is less than 6. If the pH value is 6 or more, there are less positive charges on a surface of a polishing object like silicon nitride so that it is difficult to polish a polishing object at high rate by using abrasive grains of which surface is negatively charged. From the viewpoint of polishing a polishing object like silicon nitride at sufficient polishing rate by using a polishing composition, the pH value of the polishing composition is preferably 5 or less, more preferably 4 or less, and particularly preferably 3 or less.

From the viewpoint of safety, pH value of the polishing composition is preferably 1 or more and more preferably 1.5 or more.

For adjusting the pH of the polishing composition to a desired value, a pH adjusting agent is contained in the polishing composition of the present invention. Examples of the pH adjusting agent which may be used include the following acid and chelating agent.

Specific examples of the acid include a carboxylic acid such as formic acid, acetic acid, propionic acid, butyric acid, valeric acid, capronic acid, enanthic acid, caprylic acid, pellargonic acid, capric acid, lauric acid, myristic acid, plamitic acid, margaric acid, stearic acid, oleic acid, linoleic acid, linolenic acid, arachidonic acid, docosahexanoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, furmaric acid, maleic acid, aconitic acid, amino acid, or nitrocarboxylic acid, and a sulfonic acid such as methane sulfonic acid, ethane sulfonic acid, benzene sulfonic acid, p-toluene sulfonic acid, 10-camphor sulfonic acid, isethionic acid, or taurine. Furthermore, an inorganic acid such as carbonic acid, hydrochloric acid, nitric acid, phosphoric acid, hypophosphorous acid, phosphorous acid, phosphonic acid, sulfuric acid, boric acid, hydrogen fluoride acid, orthophosphoric acid, pyrophosphoric acid, polyphosphoric acid, metaphosphoric acid, or hexametaphosphoric acid can be mentioned.

Examples of the chelating agent include polyamine, polyphosphonic acid, polyaminocarboxylic acid and polyaminophosphonic acid.

The pH adjusting agent may be used either singly or as a mixture of two or more kinds. Among those pH adjusting agents, the inorganic acid and the carboxylic acid are preferable.

Addition amount of the pH adjusting agent is not particularly limited, and the addition amount can be suitably selected to have the aforementioned pH range.

[Dispersion Medium or Solvent]

The polishing composition of the present invention contains water. It is preferable to have water as pure as possible from the viewpoint of suppressing the influence of impurities on other components in the polishing composition. Specifically, pure water or ultra-pure water obtained by removing foreign matters through a filter after impurity ions are removed using an ion exchange resin, or distilled water is preferable. Furthermore, as a dispersion medium or a solvent, an organic solvent or the like may be additionally contained for the purpose of controlling dispersion property of other components of the polishing composition.

[Other Components]

The polishing composition of the present invention may contain, if necessary, other components such as a complexing agent, a metal corrosion inhibitor, a preservative, an anti-mold agent, an oxidizing agent, a reducing agent, a surfactant, a water soluble polymer, or the like. Hereinafter, the oxidizing agent, the preservative, the anti-mold agent, and the water soluble polymer will be described.

[Oxidizing Agent]

The oxidizing agent which may added to the polishing composition has an activity of oxidizing a surface of a polishing object and can enhance the polishing rate of the polishing composition for a polishing object.

Examples of the oxidizing agent which may be used include hydrogen peroxide, sodium peroxide, barium peroxide, an organic oxidizing agent, ozone water, a silver (II) salt, an iron (III) salt, permanganese acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and a salt thereof. The oxidizing agent may be used either singly or as a mixture of two or more kinds. Among them, hydrogen peroxide, ammonium persulfate, periodic acid, hypochlorous acid, and sodium dichloroisocyanurate are preferable.

Content of the oxidizing agent in the polishing composition is preferably 0.1 g/L or more, more preferably 1 g/L or more, and even more preferably 3 g/L or more. As the content of the oxidizing agent increases, the polishing rate of the polishing composition for a polishing object is further enhanced.

Furthermore, content of the oxidizing agent in the polishing composition is preferably 200 g/L or less, more preferably 100 g/L or less, and even more preferably 40 g/L or less. As the content of the oxidizing agent decreases, the cost involved with materials of the polishing composition can be saved and a load involved with treatment of the polishing composition after polishing use, that is, a load involved with waste treatment, can be reduced. It is also possible to lower the possibility of having excessive oxidation of a surface of a polishing object by an oxidizing agent.

[Preservative and Anti-Mold Agent]

Examples of the preservative and anti-mold agent that may be added to the polishing composition of the present invention include an isothiazoline-based preservative such as 2-methyl-4-isothiazolin-3-one or 5-chloro-2-methyl-4-isothiazolin-3-one, paraoxybenzoate esters, and phenoxyethanol, and the like. These preservatives and anti-mold agents may be used either singly or in mixture of two or more kinds thereof.

[Water Soluble Polymer]

For the purpose of enhancing the hydrophilicity of the surface of a polishing object or increasing the dispersion stability of abrasive grains, a water soluble polymer may be added to the polishing composition of the present invention. Examples of the water soluble polymer include a cellulose derivative such as hydroxymethyl cellulose, hydroxyethyl cellulose (HEC), hydroxypropyl cellulose, hydroxyethylmethyl cellulose, hydroxypropylmethyl cellulose, methyl cellulose, ethyl cellulose, ethylhydroxyethyl cellulose, or carboxymethyl cellulose; an imine derivative such as poly(N-acylalkyleneimine); polyvinyl alcohol; modified (cation modified or non-ion modified) polyvinyl alcohol; polyvinyl pyrrolidone; polyvinylcaprolactam; polyoxyalkylene such as polyoxyethylene; and a copolymer containing those constitutional units. The water soluble polymer may be used either singly or as a mixture of two or more kinds.

<Method for Producing Polishing Composition>

A method for producing the polishing composition of the present invention is not particularly limited. For example, it can be obtained by mixing and stirring abrasive grains, an anionic copolymer having a structural unit represented by the above General Formula 1 or a structural unit represented by the above General Formula 2, a pH adjusting agent, water, and if necessary, other components.

The temperature at the time of mixing each component is not particularly limited, but it is preferably from 10 to 40° C. The components may be heated in order to increase a dissolution rate.

<Polishing Object>

A material to be polished of the present invention is not particularly limited if it is a polishing object of which surface is positively charged at a pH of less than 6. Examples thereof include a material to be polished which contains a polishing object including nitride such as silicon nitride, an alloy such as aluminum-magnesium or silicon-germanium, and a composite material thereof. Those polishing objects can be used either singly or in combination of two or more kinds. Meanwhile, the polishing object may have either a monolayer structure or a multilayer structure with two or more kinds. In the case of a multilayer structure, each layer may contain the same material or different materials.

To see whether or not the surface of a material to be polished is positively charged at a pH of less than 6, determination can be made by measuring, in a solution of which pH is adjusted to less than 6, the zeta potential of the material to be polished or particles consisting of the same components as the material to be polished.

Furthermore, it is sufficient that the polishing object which is positively charged at a pH of less than 6 is a material having a pH range in which it is positively charged under conditions with the pH of less than 6, and it is not necessarily to be positively charged in the whole pH range of less than 6.

Furthermore, the material to be polished as described in the present invention may have the polishing object described above and a layer containing a material which is different from the polishing object.

Examples of the material which is different from the polishing object include polycrystalline silicon, monocrystalline silicon, tetraethyl orthosilicate (TEOS), and silicon oxide. Those materials may be used either singly or in combination of two or more kinds. Furthermore, the layer containing a material which is different from the polishing object may have a monolayer structure or a multilayer structure of two or more kinds. In the case of the multilayer structure, each layer may contain the same material or different materials.

<Polishing Method Using Polishing Composition>

As described above, the polishing composition of the present invention is preferably used for polishing a polishing object like silicon nitride having a surface which is positively charged at a pH of less than 6. As such, the second aspect of the present invention is a polishing method comprising polishing a polishing object having a surface which is positively charged at a pH of less than 6 by using the polishing composition of the present invention. Furthermore, the third aspect of the present invention is a method for producing a substrate including a step for polishing by the above polishing method a polishing object having a surface which is positively charged at a pH of less than 6.

For polishing a polishing object having a surface which is positively charged at a pH of less than 6 by using the polishing composition of the present invention, an apparatus or conditions commonly used for metal polishing can be adopted. Examples of a commonly used polishing apparatus include a single-surface polishing apparatus and a two-surface polishing apparatus. According to a single-surface polishing apparatus, a substrate is maintained by using a holding device referred to as a carrier, and by rotating a platen according to pressurizing a platen provided with a polishing pad on a surface opposite to the substrate while supplying the polishing composition from the top, a single surface of a material to be polished is polished. At that time, according to a physical action based on friction between the polishing pad and polishing composition and the material to be polished, and a chemical action introduced by the polishing composition to the material to be polished, polishing is carried out. As a polishing pad, a porous material including nonwoven fabric, polyurethane, a suede, or the like can be used without any particular limitation. The polishing pad is preferably grooved such that a polishing liquid can be stored therein.

Polishing conditions for the polishing method of the present invention include polishing load, revolution number of platen, revolution number of carrier, flow rate of polishing composition, and polishing time. The polishing conditions are not particularly limited. However, the polishing load is preferably 0.1 psi or more and 10 psi or less per unit area of substrate. More preferably, it is 0.5 psi or more and 8.0 psi or less. Still more preferably, it is 1.0 psi or more and 6.0 psi or less. In general, frictional force caused by abrasive grains increases as the load increases and the mechanical processability is also improved, and thus the polishing rate increases. When it is within this range, sufficient polishing rate is exhibited so that an occurrence of substrate breakage caused by load or defects like scratch on a surface can be suppressed. The revolution number of the platen and the revolution number of the carrier are preferably 10 to 500 rpm. The supply amount is an amount allowing that the base of a material to be polished is entirely covered, and it can be adjusted depending on a size of a substrate or the like.

The polishing composition of the present invention is a single liquid type or a multi liquid type including a two liquid type. Furthermore, the polishing composition of the present invention can be also prepared according to dilution of 10 times or more, for example, of a stock solution of the polishing composition by using a dilution liquid like water.

EXAMPLES

The present invention will be described in greater detail with the following Examples and Comparative Examples. However, the technical scope of the present invention is not limited to the following Examples.

Examples 1 to 10, Comparative Examples 1 to 7

The colloidal silica shown in Table 1 as abrasive grains and an anionic copolymer were admixed in water in an amount shown in Table 3, and pH was adjusted by using a pH adjusting agent to obtain a polishing composition (mixing temperature: about 25° C., mixing time: about 10 minutes). The pH of the polishing composition was determined by a pH meter.

Meanwhile, types of the abrasive grains and polishing object shown in Table 3 are as described in the following Table 1.

TABLE 1

| Abrasive grains |
| --- |
| A: Al doped silica (average primary particle diameter: 35 nm, average secondary particle diameter: 68 nm) |
| B: colloidal silica having surface immobilized with sulfonic acid (average primary particle diameter: 35 nm, average secondary particle diameter: 68 nm) |
| Material to be polished |
| Silicon nitride (SiN) |

Polishing rate was measured when a substrate as a polishing object is polished using the polishing composition of the present invention under the following conditions.

TABLE 2

| Conditions for polishing |
| --- |
| Polishing machine: Table top polishing machine EJ-380IN manufactured by Engis Japan Corporation. |
| Polishing pad: pad made of polyurethane |
| Polishing pressure: 1.2 psi (concave part), 3.9 psi (convex part) |
| Revolution number of platen: 60 rpm |
| Flow rate of polishing composition: 100 ml/min |
| Film thickness measuring device: Optical interference type film thickness measuring device. |

The polishing rate was calculated according to the following equation.

Polishing rate[Å/min]=Amount of change in film thickness after polishing for 1 minute The result of measuring the polishing rate is shown in the following Table 3. Meanwhile, the polishing rate ratio shown in Table 3 is a value which is calculated by dividing the polishing rate of convex part by the polishing rate of concave part.

TABLE 3

| | | Abrasive grains | | | | | Organic compound | | | | SiN polishing rate (Å/min) | | |
| --- | --- | --- | --- | --- | --- | --- | --- | --- | --- | --- | --- | --- | --- |
| | No. | Type | Concentration (% by mass) | pH adjusting agent | pH | Compound name | Unit structure 1 | Unit structure 2 | Molecular weight | Addition amount (ppm) | Concave part (1.2 psi) | Convex part (3.9 psi) | Polishing rate ratio |
| Example | 1 | A | 2 | Succinic acid | 3 | Styrene sulfonic acid-maleic acid copolymer | Styrene sulfonic acid | Maleic acid | 10000 | 50 | 32 | 443 | 13.92 |
| | 2 | A | 2 | Succinic acid | 3 | Styrene sulfonic acid-methacrylic acid copolymer | Styrene sulfonic acid | Methacrylic acid | 20000 | 50 | 4 | 433 | 108.25 |

TABLE 3-continued

| | No. | Abrasive grains Type | Concentration (% by mass) | pH adjusting agent | pH | Compound name | Organic compound Unit structure 1 | Unit structure 2 | Molecular weight | Addition amount (ppm) | SiN polishing rate (Å/min) Concave part (1.2 psi) | Convex part (3.9 psi) | Polishing rate ratio |
|---|---|---|---|---|---|---|---|---|---|---|---|---|---|
| | 3 | A | 2 | Succinic acid | 3 | Vinyl sulfonic acid-acrylic acid copolymer | Vinyl sulfonic acid | Acrylic acid | 5000 | 100 | 25 | 429 | 17.16 |
| | 4 | A | 2 | Succinic acid | 3 | Acrylic acid-maleic acid copolymer | Acrylic acid | Maleic acid | 5000 | 200 | 20 | 428 | 21.40 |
| | 5 | A | 5 | Succinic acid | 3 | Styrene sulfonic acid-maleic acid copolymer | Styrene sulfonic acid | Maleic acid | 10000 | 200 | 32 | 625 | 19.53 |
| | 6 | A | 10 | Succinic acid | 3 | Styrene sulfonic acid-maleic acid copolymer | Styrene sulfonic acid | Maleic acid | 10000 | 500 | 13 | 684 | 52.62 |
| | 7 | B | 2 | Succinic acid | 3 | Styrene sulfonic acid-maleic acid copolymer | Styrene sulfonic acid | Maleic acid | 10000 | 50 | 28 | 458 | 16.36 |
| | 8 | B | 2 | Nitric acid | 2 | Styrene sulfonic acid-maleic acid copolymer | Styrene sulfonic acid | Maleic acid | 10000 | 50 | 32 | 485 | 15.16 |
| | 9 | B | 2 | Nitric acid | 4 | Styrene sulfonic acid-maleic acid copolymer | Styrene sulfonic acid | Maleic acid | 10000 | 50 | 15 | 289 | 19.27 |
| | 10 | B | 2 | Nitric acid | 5 | Styrene sulfonic acid-maleic acid copolymer | Styrene sulfonic acid | Maleic acid | 10000 | 50 | 5 | 149 | 29.80 |
| Comparative Example | 1 | A | 2 | Succinic acid | 3 | — | — | — | — | — | 176 | 511 | 2.91 |
| | 2 | A | 2 | Succinic acid | 3 | Polyvinyl pyrrolidone | — | — | 30000 | 50 | 189 | 492 | 2.61 |
| | 3 | A | 2 | Succinic acid | 3 | Polyethylene glycol | — | — | 400 | 50 | 165 | 549 | 3.33 |
| | 4 | A | 2 | Succinic acid | 3 | Polyethylene sulfonic acid | — | — | 10000 | 50 | 111 | 428 | 3.86 |
| | 5 | A | 2 | Succinic acid | 3 | Polyethylene sulfonic acid | — | — | 500000 | 50 | 156 | 429 | 2.75 |
| | 6 | A | 2 | Succinic acid | 3 | Polyethylene sulfonic acid | — | — | 1000000 | 50 | 132 | 350 | 2.65 |
| | 7 | A | 2 | Succinic acid | 6 | Styrene sulfonic acid-maleic acid copolymer | Styrene sulfonic acid | Maleic acid | 10000 | 50 | 27 | 98 | 3.63 |

As it is clearly shown from the result of polishing rate ratio of Table 3, it was found that the convex part of a silicon nitride film as a polishing object is scarped-off with high selectivity compared to the concave part when the polishing composition of Examples 1 to 10 of the present invention is used.

On the other hand, the polishing composition in which an organic compound is not added (Comparative Example 1), the polishing composition in which a non-ionic organic polymer is used (Comparative Examples 2 and 3), the polishing composition in which a homopolymer having a strong acidic group is used (Comparative Examples 4 to 6), and the polishing composition in which an anionic copolymer is used but the pH is 6 (Comparative Example 7) did not yield high polishing rate ratio and did not exhibit the activity of selectively scraping-off the convex part.

The present application is based on the Japanese patent application No. 2014-69265 filed on Mar. 28, 2014, and a disclosed content thereof is incorporated herein as a whole by reference.

The invention claimed is:

1. A polishing composition for use in polishing a polishing object having a surface which is positively charged at a pH of less than 6, comprising water,
abrasive grains, and
an anionic copolymer having a unit structure represented by the following Formula 1 or the following Formula 2, and having a pH of less than 6,
wherein the anionic copolymer has at least two acidic groups having different acidities, wherein the abrasive grains have a surface which is negatively charged at a pH of less than 6, and the abrasive grains are Al (aluminum) doped colloidal silica or colloidal silica immobilized with organic acid;
wherein the anionic copolymer has a weight average molecular weight of 5000 to 20000;
a content of the abrasive grains in the polishing composition is in a range of 2 to 10% by mass, and
a content of the anionic copolymer in the polishing composition is in a range of 50 to 500 ppm by mass,

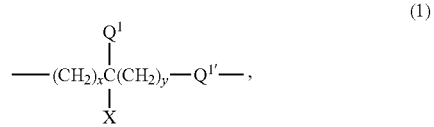

wherein $Q^1$ is selected from the group consisting of hydrogen; an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; or an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^{1'}$ is any one of a single bond, an ether bond, an ester bond, an amide bond, and a carbonyl bond, x is an integer of from 0 to 10, y is an integer of from 0 to 10, X is an acidic group selected from the group consisting of a sulfonic acid group, a carboxyl group, a hydroxyl group, and a phosphoric acid group; an aliphatic hydrocarbon group with 1 to 10 carbon atoms having at least one acidic group selected from the group consisting of a sulfonic acid group, a carboxyl group, a hydroxyl group, and a phosphoric acid group; or an aromatic hydrocarbon group with 6 to 12 carbon atoms having at least one acidic group selected from the group consisting of a sulfonic acid group, a carboxyl group, a hydroxyl group, and a phosphoric acid group;

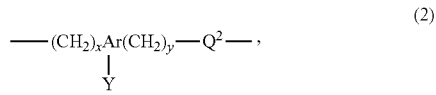
(2)

wherein Ar is a substituted or non-substituted aromatic group with 6 to 12 carbon atoms, provided that when Ar is a substituted aromatic group, a substituent includes an alkyl group with 1 to 6 carbon atoms selected from the group consisting of a methyl group, an ethyl group, a n-propyl group, an isopropyl group, a n-butyl group, a sec-butyl group, a tert-butyl group, a n-pentyl group, and a n-hexyl group; and an alkoxy group with 1 to 6 carbon atoms selected from the group consisting of a methoxy group, an ethoxy group, a n-propoxy group, an isopropoxy group, a n-butoxy group, a sec-butoxy group, a tert-butoxy group, a n-pentoxy group, and a n-hexoxy group, $Q^2$ is any one of a single bond, an ether bond, an ester bond, an amide bond, and a carbonyl bond, x is an integer of from 0 to 10, y is an integer of from 0 to 10, Y is an acidic group selected from the group consisting of a sulfonic acid group, a carboxyl group, a hydroxyl group, and a phosphoric acid group; an aliphatic hydrocarbon group with 1 to 10 carbon atoms having at least one acidic group selected from the group consisting of a sulfonic acid group, a carboxyl group, a hydroxyl group, and a phosphoric acid group; or an aromatic hydrocarbon group with 6 to 12 carbon atoms having at least one acidic group selected from the group consisting of a sulfonic acid group, a carboxyl group, a hydroxyl group, and a phosphoric acid group.

2. The polishing composition according to claim 1, wherein the anionic copolymer is a vinyl-based copolymer which has the unit structure represented by the Formula 1.

3. The polishing composition according to claim 1, wherein the polishing object is a substrate comprising silicon nitride.

4. The polishing composition according to claim 1, wherein the abrasive grains are Al (aluminum) doped colloidal silica or colloidal silica immobilized with sulfonic acid.

5. The polishing composition according to claim 1, wherein the anionic copolymer is at least one selected from the group consisting of styrene sulfonic acid-maleic acid copolymer, styrene sulfonic acid-methacrylic acid copolymer, vinyl sulfonic acid-acrylic acid copolymer, and acrylic acid-maleic acid copolymer.

* * * * *